US009087622B2

(12) United States Patent  
Cheon et al.

(10) Patent No.: US 9,087,622 B2
(45) Date of Patent: Jul. 21, 2015

(54) NITRILE SOLVENT COMPOSISTIONS FOR INKJET PRINTING OF ORGANIC LAYERS

(75) Inventors: Kwang-Ohk Cheon, Holland, PA (US); Michael Inbasekaran, Lambertville, NJ (US)

(73) Assignee: Universal Display Corporation, Ewing, NJ (US)

( * ) Notice: Subject to any disclaimer, the term of this patent is extended or adjusted under 35 U.S.C. 154(b) by 390 days.

(21) Appl. No.: 13/508,490

(22) PCT Filed: Dec. 1, 2010

(86) PCT No.: PCT/US2010/058556
§ 371 (c)(1),
(2), (4) Date: Jun. 19, 2012

(87) PCT Pub. No.: WO2011/087601
PCT Pub. Date: Jul. 21, 2011

(65) Prior Publication Data
US 2012/0256136 A1 Oct. 11, 2012

Related U.S. Application Data

(60) Provisional application No. 61/289,016, filed on Dec. 22, 2009.

(51) Int. Cl.
| | |
|---|---|
| *H01B 1/12* | (2006.01) |
| *B05D 5/12* | (2006.01) |
| *C09D 11/00* | (2014.01) |
| *C09K 11/00* | (2006.01) |
| *H01B 1/20* | (2006.01) |
| *C09D 11/328* | (2014.01) |
| *C09D 11/36* | (2014.01) |
| *C09D 11/50* | (2014.01) |
| *H01L 51/00* | (2006.01) |
| *H01L 51/50* | (2006.01) |

(52) U.S. Cl.
CPC .. *H01B 1/12* (2013.01); *B05D 5/12* (2013.01); *C09D 11/328* (2013.01); *C09D 11/36* (2013.01); *C09D 11/50* (2013.01); *H01B 1/20* (2013.01); *H01L 51/0005* (2013.01); *H01L 51/0007* (2013.01); *H01L 51/0085* (2013.01); *H01L 51/0087* (2013.01); *H01L 51/5012* (2013.01)

(58) Field of Classification Search
CPC .......... H01B 1/12; H01B 1/122; H01B 1/124; H01B 1/20; B05D 5/12; C09D 11/00; H01L 51/0032; H01L 51/0051; C09K 11/06
USPC ............................................ 252/500; 257/40
See application file for complete search history.

(56) References Cited

U.S. PATENT DOCUMENTS

| | | | | |
|---|---|---|---|---|
| 5,281,730 | A | * | 1/1994 | Zambounis ................... 552/303 |
| 8,038,903 | B2 | * | 10/2011 | Spreitzer et al. ......... 252/301.16 |
| 2008/0226941 | A1 | | 9/2008 | Becker et al. |
| 2008/0265214 | A1 | * | 10/2008 | Steiger et al. ................ 252/500 |

FOREIGN PATENT DOCUMENTS

CN    101243559 A    8/2008

OTHER PUBLICATIONS

PCT International Search Report and Written Opinion for PCT/US2010/058556, mailed May 27, 2011.

* cited by examiner

*Primary Examiner* — Mark Kopec
(74) *Attorney, Agent, or Firm* — Duane Morris LLP

(57) ABSTRACT

A liquid composition (e.g., inkjet fluid) for forming an organic layer of an organic electronic device (e.g., an OLED). The liquid composition comprises a small molecule organic semiconductor material mixed in an aromatic solvent. The aromatic solvent, when left as a residue in the organic layer, is capable of presenting relatively reduced resistivity to charge transport or facilitating charge transport in the organic layer that is deposited, as compared to other conventional solvents. In certain embodiments, the aromatic solvent compound has the following formula: wherein R represents one or more optional substituents on the benzene ring, wherein each R is independently an aliphatic group containing from 1-15 carbon atoms; and wherein X is a substitution group that contains an electron-withdrawing group selected from nitrile, sulfonyl, or trifluoromethyl.

22 Claims, 2 Drawing Sheets

NITRILE SOLVENT COMPOSISTIONS FOR INKJET PRINTING OF ORGANIC LAYERS

CROSS-REFERENCES

This application is a U.S. national stage application under 35 U.S.C. §371 of PCT/US2010/058556, filed Dec. 1, 2010, which claims the benefit of U.S. Provisional Application Ser. No. 61/289,016 (filed on 22 Dec. 2009), which is incorporated by reference herein.

The claimed invention was made by, on behalf of and/or in connection with one or more of the following parties to a joint university corporation research agreement: Regents of the University of Michigan, Princeton University, The University of Southern California, and Universal Display Corporation. The agreement was in effect on and before the date the claimed invention was made, and the claimed invention was made as a result of activities undertaken within the scope of the agreement.

TECHNICAL FIELD

The present invention relates to methods for making organic layers in organic electronic devices, such as organic light emitting devices.

BACKGROUND

Traditionally, organic light emitting devices (OLEDs) have been fabricated by vacuum deposition for small molecule materials, and by spin-coating or dip coating for polymeric materials. More recently, inkjet printing has been used to directly deposit organic thin film layers in the fabrication of OLEDs. For inkjet printing of polymeric materials, a variety of conventional solvents can be used, such as toluene or xylene. However, these solvents conventionally used for inkjet printing of polymeric materials often do not work as well for the deposition of small molecule materials because their relatively low boiling points allow the solvent to dry too fast, causing the print nozzles to clog. Also, upon deposition, too rapid drying of the solvent can result in inferior film morphology.

Thus, inkjet printing of small molecule materials often requires the use of relatively higher boiling point solvents. However, using higher boiling point solvents present their own problems. Because of their higher boiling point, such solvents can be difficult to remove from the deposited organic layer. Baking at high temperatures can accelerate the removal of the solvent, but this can cause heat degradation of the device. Also, even baking at high temperatures may not completely remove the solvent residue from the deposited organic layer. Since solvent materials are generally electrically insulative, solvent residue remaining in the deposited organic layer can interfere with the performance of electronic devices. Thus, there is a need for an improved inkjet fluid formulation suitable for the inkjet printing of small molecule materials to form organic layers.

SUMMARY

The present invention provides an improved method of forming an organic layer by solution processing (e.g., inkjet printing) using an aromatic solvent that will create less resistance to the transport of charge carriers, such as electrons, thus allowing improved device performance. Organic electronic devices, such as OLEDs, using organic layers deposited by the method may have improved device performance.

In one embodiment, the present invention provides a liquid composition comprising; a small molecule organic semiconductor material at a concentration in the range of 0.01-10 wt %; and an aromatic solvent having a melting point of 25° C. or lower, the aromatic solvent compound having the following formula:

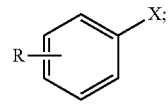

wherein R represents one or more optional substituents on the benzene ring, wherein each R is independently an aliphatic group containing from 1-15 carbon atoms; and wherein X is a substitution group that contains an electron-withdrawing group selected from nitrile, sulfonyl, or trifluoromethyl.

In another embodiment, the present invention provides a liquid composition comprising: a small molecule host compound; a small molecule phosphorescent emitting compound; and an aromatic solvent having a melting point of 25° C. or lower, wherein the aromatic solvent has an electrical resistivity lower than that of anisole, and wherein the aromatic solvent compound has an energy band gap wider than that of the phosphorescent emitting compound.

In another embodiment, the present invention provides a method of forming an organic layer for an organic electronic device, comprising: depositing the liquid composition on a surface; and drying the liquid composition to form the organic layer on the surface.

In another embodiment, the present invention provides an organic electronic device comprising an organic layer, the organic layer comprising a small molecule organic semiconductor material and an aromatic nitrile compound having a melting point of 25° C. or lower; the aromatic nitrile compound having the following formula:

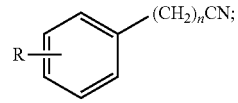

wherein "n" is 0-6; and wherein R represents one or more optional substituents on the benzene ring, wherein each R is independently an aliphatic group containing from 1-15 carbon atoms.

DETAILED DESCRIPTION

Figure 1:
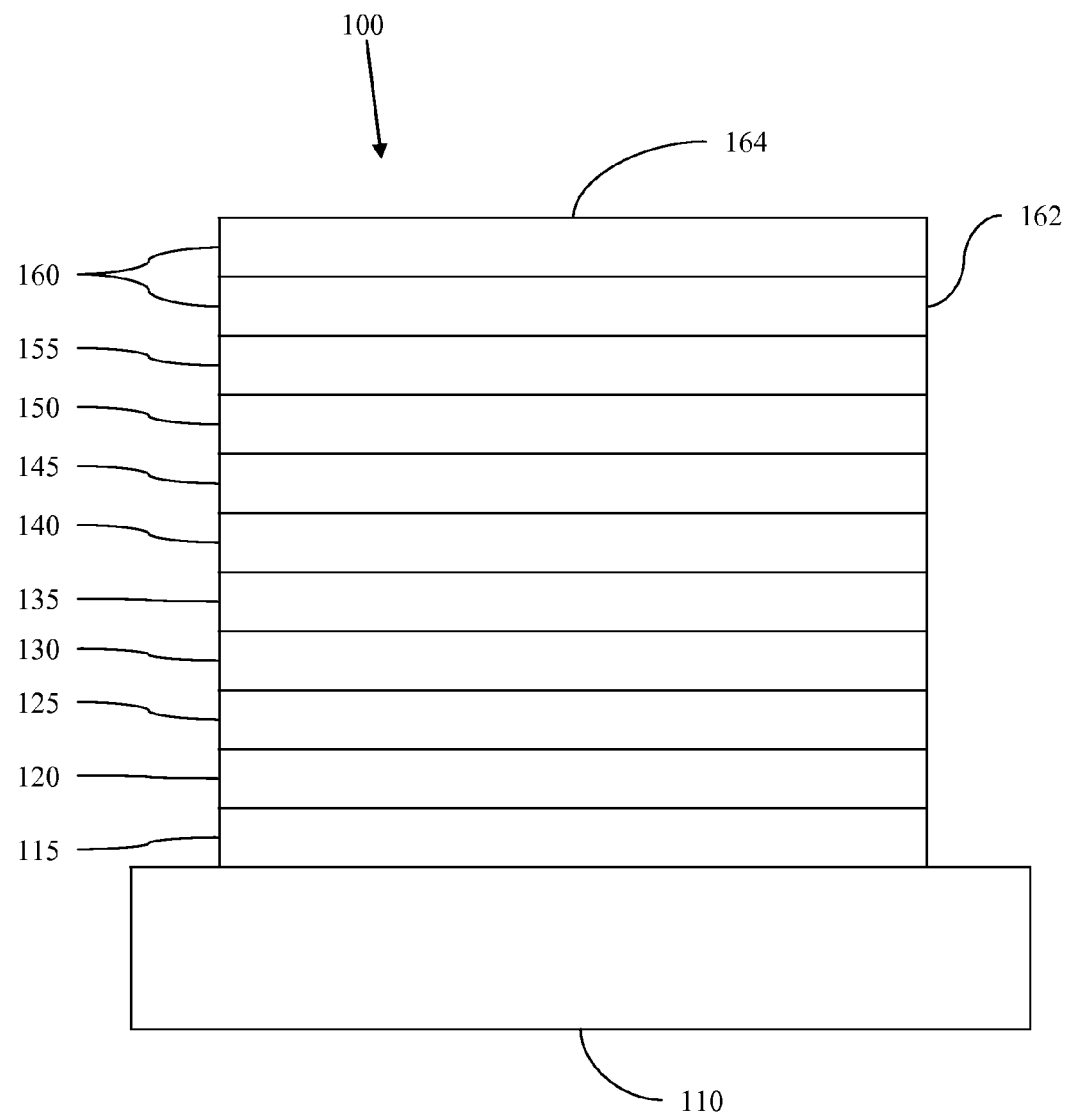
FIG. 1 shows the structure of an OLED according to an embodiment of the present invention.

The meaning of the following terms, as intended to be used herein, are as follows:

The term "aliphatic" means a saturated or unsaturated hydrocarbyl in a linear, branched, or non-aromatic ring. The carbons can be joined by single bonds (alkyls), double bonds (alkenyls), or triple bonds (alkenyls). Besides hydrogen, other elements such as oxygen, nitrogen, sulfur, or halogens can be bound to the carbons as substitutions. The term "aliphatic" also encompasses hydrocarbyls containing heteroatoms, such as oxygen, nitrogen, sulfur, phosphorus, and silicon in place of carbon atoms.

The term "alkyl" means alkyl moieties and encompasses both straight and branched alkyl chains. Additionally, the alkyl moieties themselves may be substituted with one or more substituents. The term "heteroalkyl" means alkyl moieties that include heteroatoms.

The term "lower," when referring to an aliphatic or any of the above-mentioned types of aliphatics, means that the aliphatic group contains from 1-15 carbon atoms. For example, lower alkyl groups include methyl, ethyl, propyl, isopropyl, butyl, isobutyl, tert-butyl, and the like.

The term "aryl" means a hydrocarbyl containing at least one aromatic ring, including single-ring groups and polycyclic ring systems. The term "heteroaryl" means a hydrocarbyl containing at least one heteroaromatic ring (i.e., containing heteroatoms), including single-ring groups and polycyclic ring systems. The polycyclic rings may have two or more rings in which two carbon atoms are common by two adjoining rings (i.e., the rings are "fused"), wherein at least one of the rings is aromatic or heteroaromatic. The term "lower aryl" or "lower heteroaryl" means an aryl or heteroaryl, respectively, containing from 3-15 carbon atoms.

Examples of aryl groups include benzene, naphthalene, anthracene, phenanthrene, perylene, tetracene, pyrene, benzpyrene, chrysene, triphenylene, acenaphthene, fluorene, and those derived therefrom. Examples of heteroaryl groups include furan, benzofuran, thiophen, benzothiophen, pyrrole, pyrazole, triazole, imidazole, oxadiazole, oxazole, thiazole, tetrazole, indole, carbazole, pyrroloimidazole, pyrrolopyrazole, pyrrolopyrole, thienopyrrole, thienothiophen, furopyrrole, furofuran, thienofuran, benzoisoxazole, benzoisothiazole, benzoimidazole, pyridine, pyrazine, pyridazine, pyrimidine, triazine, quinoline, isoquinoline, cinnnoline, quinoxaline, phenanthridine, benzoimidazole, perimidine, quinazoline, quinazolinone, azulene, and those derived therefrom.

The present invention relates to the forming of organic layers by solution processing techniques. In one aspect, the present invention provides a liquid composition which can be used for forming an organic layer by solution processing techniques. The liquid composition comprises a small molecule organic semiconductor material mixed in an aromatic solvent. By "aromatic solvent," we mean that the solvent compound has one or more aromatic groups in the molecular structure, such as the aryl or heteroaryl groups described above.

The aromatic solvents used in the present invention may have various chemical/physical properties that make it useful for forming organic layers by solution processing techniques, such as inkjet printing. For example, the aromatic solvent may have a melting point of 25° C. or below. In some cases, the aromatic solvent compound has a molecular weight in the range of 95-250. In some cases, the aromatic solvent has a boiling point of 160° C. or higher; and in some cases, 200° C. or higher. In some cases, the boiling point range may be up to 260° C., but other boiling point ranges are also possible. Boiling points in this range may be useful in preventing nozzle clogging of the inkjet print head.

The organic semiconductor material is a small molecule organic compound (including organometallic compounds) which is capable of exhibiting semiconducting properties, i.e., in which the energy gap between conduction and valence bands is in the range of 0.1-4 eV. The small molecule organic semiconductor material may be any of those known or proposed to be used in the fabrication of organic electronic devices, such as organic light emitting devices. For example, the organic semiconductor material may be a charge transport compound (hole or electron transporting) or an emissive phosphorescent compound.

The term "small molecule" refers to any compound that is not a polymer, and "small molecules" may actually be quite large. Small molecules may include repeat units in some circumstances. For example, using a long chain alkyl group as a substituent does not exclude the molecule from being a "small molecule." In general, a small molecule has a well-defined chemical formula with a single molecular weight, whereas a polymer has a chemical formula and a molecular weight that may vary from molecule to molecule. The molecular weight of the small molecule organic semiconductor material is typically 3,000 or less.

In some cases, the organic semiconductor material is a phosphorescent emitting compound. Any of various types of phosphorescent emitting compounds may be suitable, including the organometallic complexes of transition metals described in U.S. Pat. No. 6,902,830 (Thompson et. al.); and U.S. Published Appln. No. 2006/0251923 (Lin et al.), No. 2007/0088167 (Lin et al.), No. 2006/0008673 (Kwong et al.), and No. 2007/0003789 (Kwong et al.), all of which are incorporated by reference herein.

The concentration of the organic semiconductor material in the liquid composition will vary according to the particular application. In certain embodiments, the organic semiconductor material is provided at a concentration that is suitable for inkjet printing. In some cases, the concentration of the organic semiconductor material is in the range of 0.01-10 wt %; and in some cases, in the range of 0.01-2 wt %; and in some cases, in the range of 0.1-1 wt %. The viscosity of the liquid composition will vary according to the particular application. For use in inkjet printing, an appropriate viscosity can be in the range of 1-25 mPas or 5-25 mPas. The interaction of the aromatic solvent with the organic semiconductor material may affect the viscosity of the liquid composition. As such, the viscosity of the liquid composition may be adjusted by varying the selection of the aromatic solvent and/or the organic semiconductor material, or by varying the relative amounts of each. The liquid composition may also contain any of various other types of materials used in the fabrication of organic electronic devices, such as OLEDs. The organic layer may be any of those used in OLEDs (e.g., an emissive layer, a hole injection layer, or a hole transporting layer in an OLED).

In cases where the liquid composition is used to make an emissive layer of an OLED, in some cases, the liquid composition may include a small molecule host compound and a small molecule phosphorescent emitting compound as a dopant in the emissive layer. A host is a compound in the emissive layer that functions as the component which receives the hole/electron recombination energy and then by an emission/absorption energy transfer process, transfers that excitation energy to the phosphorescent dopant compound. The phosphorescent dopant is typically present in lower concentrations than the host compound. Examples of host compounds include $Alq_3$ [aluminum(III)tris(8-hydroxyquinoline)], mCP (1,3-N,N-dicarbazole-benzene), and CBP (4,4'-N,N-dicarbazole-biphenyl). Other materials that may be used as phosphorescent emitting compounds or host compounds are shown in Table 2 below.

The liquid composition is deposited onto the surface using any suitable solution processing technique known in the art. For example, the liquid composition can be deposited using a printing process, such as inkjet printing, nozzle printing, offset printing, transfer printing, or screen printing; or for example, using a coating process, such as spray coating, spin coating, or dip coating. After deposition of the liquid composition, the aromatic solvent is removed, which may be performed using any conventional method such as vacuum drying or heating.

A variety of different types of aromatic solvents may be suitable for use in the present invention, as selected for their ability to present relatively reduced resistivity to charge transport or facilitate charge transport, as compared to other conventional solvents when they are left as a residue in the organic layer that is deposited. In certain embodiments, the aromatic solvent compound has the following formula:

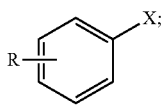

wherein R represents one or more optional substituents on the benzene ring, wherein each R is independently an aliphatic group containing from 1-15 carbon atoms; and wherein X is a substitution group that contains an electron-withdrawing group. In some cases, one or more of the optional R substituents is a lower alkyl group, such as, for example, methyl, ethyl, propyl, isopropyl, butyl, isobutyl, or tert-butyl.

Where the liquid composition is used for making an emissive layer, in some cases, the electron-withdrawing group(s) in X are selected from ones that avoid or minimize quenching of phosphorescence emission in the emissive layer. For example, the electron-withdrawing group in X may be a nitrile, sulfonyl, or trifluoromethyl group. In certain embodiments, the aromatic solvent is an aromatic nitrile solvent, with X containing a nitrile group. One particular example of an aromatic nitrile solvent has the following formula:

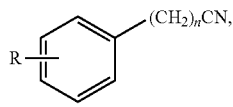

wherein "n" is 0-6. Representative examples of solvents having this formula include the following:

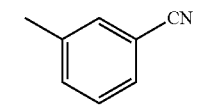

m-tolunitrile (BP~210° C.)

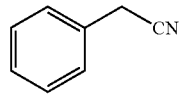

phenylacetonitrile (BP~230° C.)

Where the liquid composition is used for making an emissive layer, in certain embodiments, the aromatic solvent may be selected for lower electrical resistivity (as compared to other solvents), while also avoiding quenching of phosphorescence emission. By using an aromatic solvent having lower electrical resistivity, any solvent residue left in the emissive layer can present less resistance to charge transport or facilitate charge transport, thereby improving device performance. In some cases, the aromatic solvent has an electrical resistivity lower than that of toluene; and in some cases, lower than that of anisole; and in some cases, lower than that of ethyl benzoate. The electrical resistivity of the solvent can vary according to the presence of functional groups on the solvent compound that modify the polarity of the compound molecule. One way of measuring the resistivity of solvents is by using the technique described in ASTM D5682-08 ("Standard Test Methods for Electrical Resistivity of Liquid Paint and Related Materials").

Further, in this embodiment, the aromatic solvent compound has an energy band gap that is relatively wide so as to reduce or avoid quenching of phosphorescence emission. In some cases, the solvent compound has an energy band gap that is wider than that of the phosphorescent emitting compound. The energy band gap of the solvent molecule can be adjusted by the use of various functional groups. For example, the aromatic nitrile solvents described above may have relatively wide energy band gaps. Other types of aromatic solvents having relatively lower electrical resistivity and relatively wide energy band gaps may also be used in the present invention.

In some cases, the liquid composition itself may use a blend of solvents, including solvents that are not aromatic solvents of the present invention. In such cases, the aromatic solvent(s) constitutes at least 25% (by volume) of the solvent volume in the liquid composition.

In another aspect, the present invention provides a method of forming an organic layer using a liquid composition of the present invention. The liquid composition is deposited on a surface, and then dried to form the organic layer. Upon drying, the aromatic solvent in the liquid composition may remain in the organic layer as a solvent residue.

In another aspect, the present invention provides an organic light emitting device having an organic layer, wherein the organic layer comprises an aromatic solvent compound as described herein. The organic layer may contain the aromatic solvent compound as a solvent residue, i.e., solvent material that is left behind after drying. The aromatic solvent compound may be present in the organic layer at a concentration of up to 1 wt % of the organic layer, and in some cases, up to 0.1 wt %. Because the aromatic solvent compound is capable of presenting less resistance to hole and/or electron transport than other conventional solvents, the device may be able to tolerate relatively higher concentrations of the aromatic solvent compound in the organic layer, as compared to the situation if other solvents were used.

The present invention can be used in the fabrication of a variety of organic electronic devices, including organic light emitting devices, organic field-effect transistors (OFETs), organic thin-film transistors (OTFTs), organic photovoltaic devices, and organic solar cells, such as those disclosed in U.S. Appln. Publication No. 2005/0072021 (Steiger et al.), which is incorporated by reference herein. For example, FIG. 1 shows an OLED 100 that may be made using the present invention. OLED 100 has an architecture that is well-known in the art (see, for example, U.S. Appln. Publication No. 2008/0220265 to Xia et al., which is incorporated by reference herein). As seen in FIG. 1, OLED 100 has a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, and a cathode 160. Cathode 160 is a compound cathode having a first conductive layer 162 and a second conductive layer 164. Where a first layer is described as being "over" a second layer, the first layer is disposed further away from substrate. There may be other layers between the first and second layer, unless it is specified that the first layer is "in physical contact with" the second layer. For example, a cathode may be described as being disposed "over" an anode, even though there are various organic layers in between.

EXAMPLES

Specific representative embodiments of the invention will now be described, including how such embodiments may be made. It is understood that the specific methods, materials, conditions, process parameters, apparatus, and the like do not necessarily limit the scope of the invention.

Five experimental devices were made as follows. For devices 1-4, a hole injection layer (approximately 100 Å thick) was deposited by inkjet printing onto an ITO anode using a mixture of 0.1 wt % of Compound A and 3 wt % (relative to Compound A) of Compound Mixture B in tetralone solvent. A hole transport layer (approximately 300 Å thick) was deposited by inkjet printing onto the hole injection layer using 0.2 wt % of Compound C in tetralone solvent. An emissive layer (approximately 300 Å thick) was deposited by inkjet printing using Compound D:Compound Mixture E (88:12 ratio) in the solvents shown in Table 1 below. A 50 Å hole blocking layer containing Compound F, a 500 Å electron transport layer containing Alq$_3$ [aluminum(III)tris(8 hydroxyquinoline)], and a LiF/aluminum cathode were sequentially vacuum deposited in a conventional fashion. Device 5 was made in the same manner, except that NS60 (Nippon Steel Chemical Co., Tokyo, Japan) was used in the hole blocking layer (100 Å thick) and the Alq$_3$ electron transport layer was 450 Å thick.

-continued

Compound Mixture B

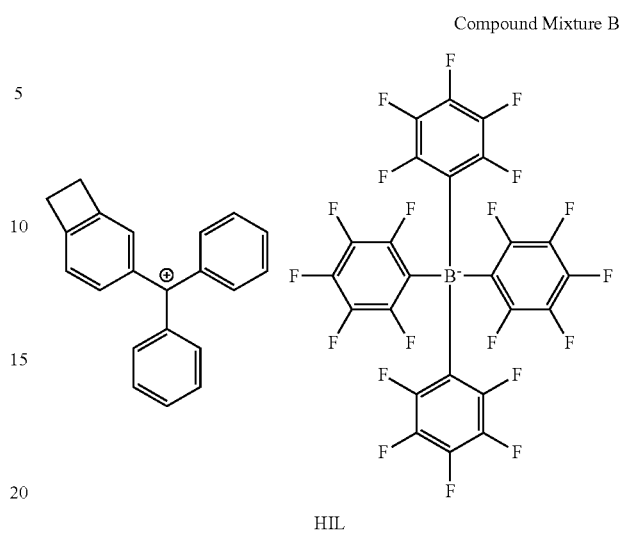

HIL

Compound C

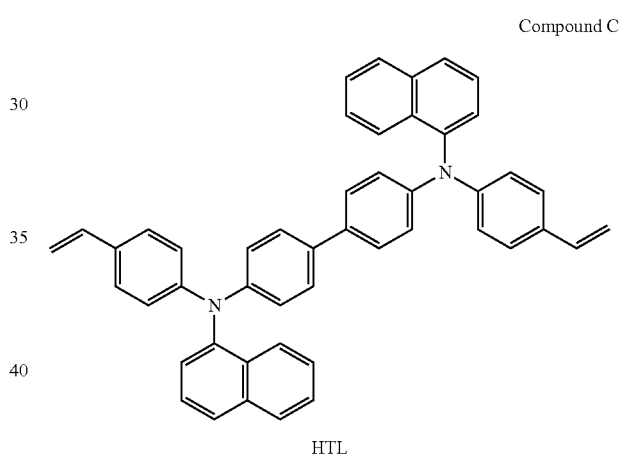

HTL

Compound D

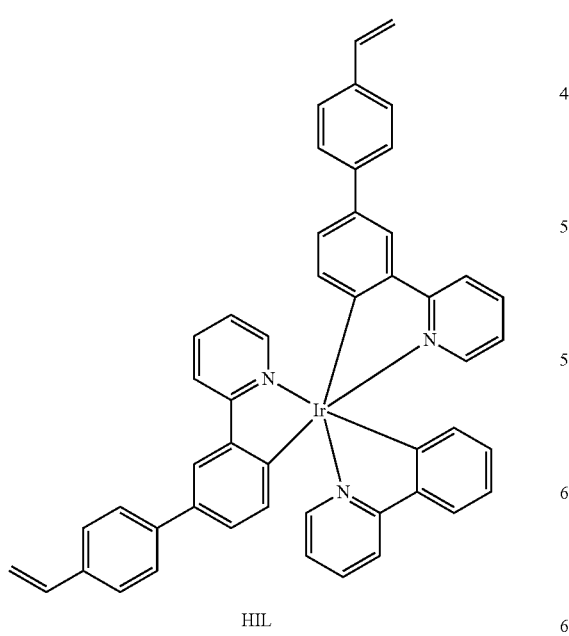

EML

Compound A

HIL

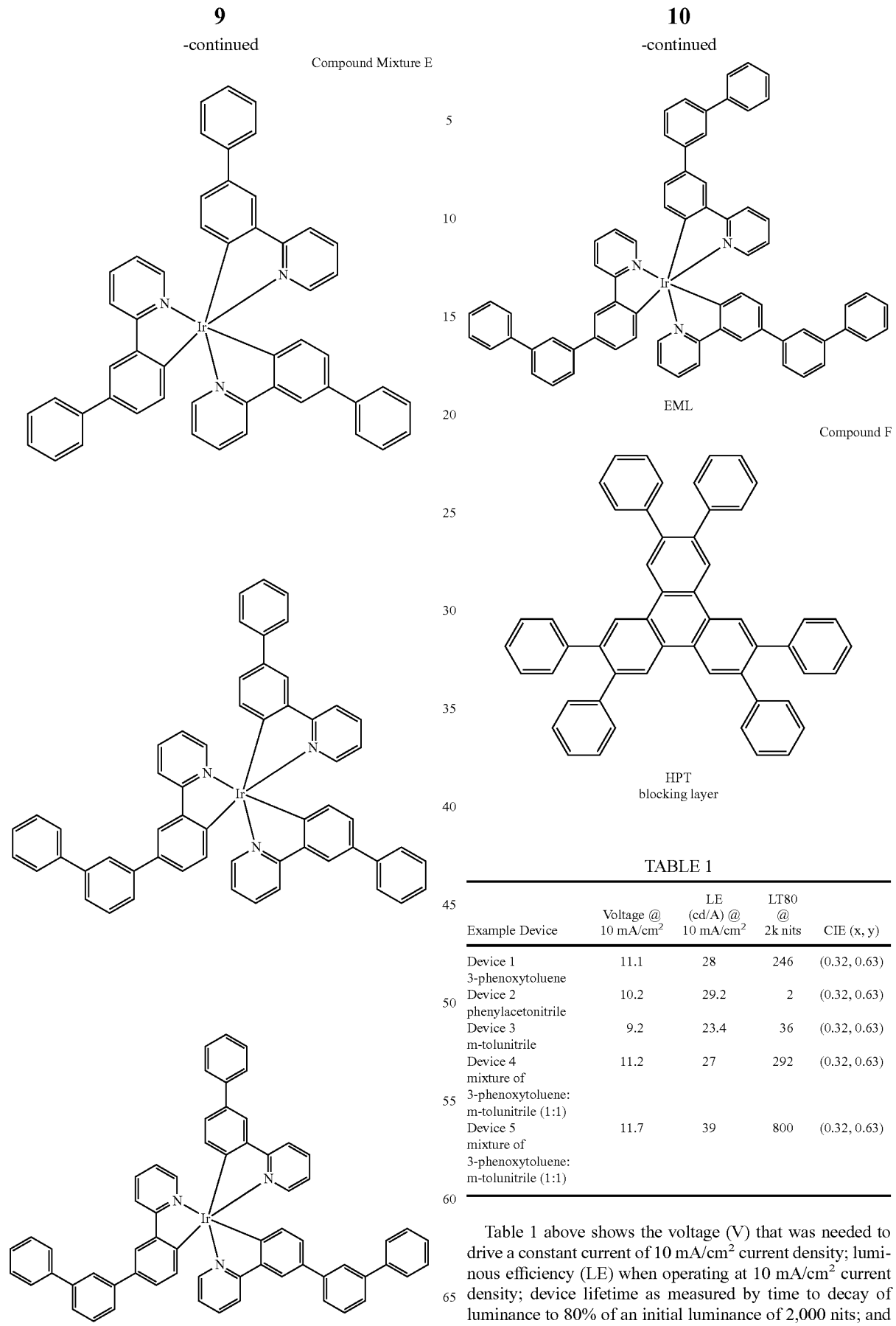

TABLE 1

| Example Device | Voltage @ 10 mA/cm$^2$ | LE (cd/A) @ 10 mA/cm$^2$ | LT80 @ 2k nits | CIE (x, y) |
| --- | --- | --- | --- | --- |
| Device 1 3-phenoxytoluene | 11.1 | 28 | 246 | (0.32, 0.63) |
| Device 2 phenylacetonitrile | 10.2 | 29.2 | 2 | (0.32, 0.63) |
| Device 3 m-tolunitrile | 9.2 | 23.4 | 36 | (0.32, 0.63) |
| Device 4 mixture of 3-phenoxytoluene: m-tolunitrile (1:1) | 11.2 | 27 | 292 | (0.32, 0.63) |
| Device 5 mixture of 3-phenoxytoluene: m-tolunitrile (1:1) | 11.7 | 39 | 800 | (0.32, 0.63) |

Figure 2:
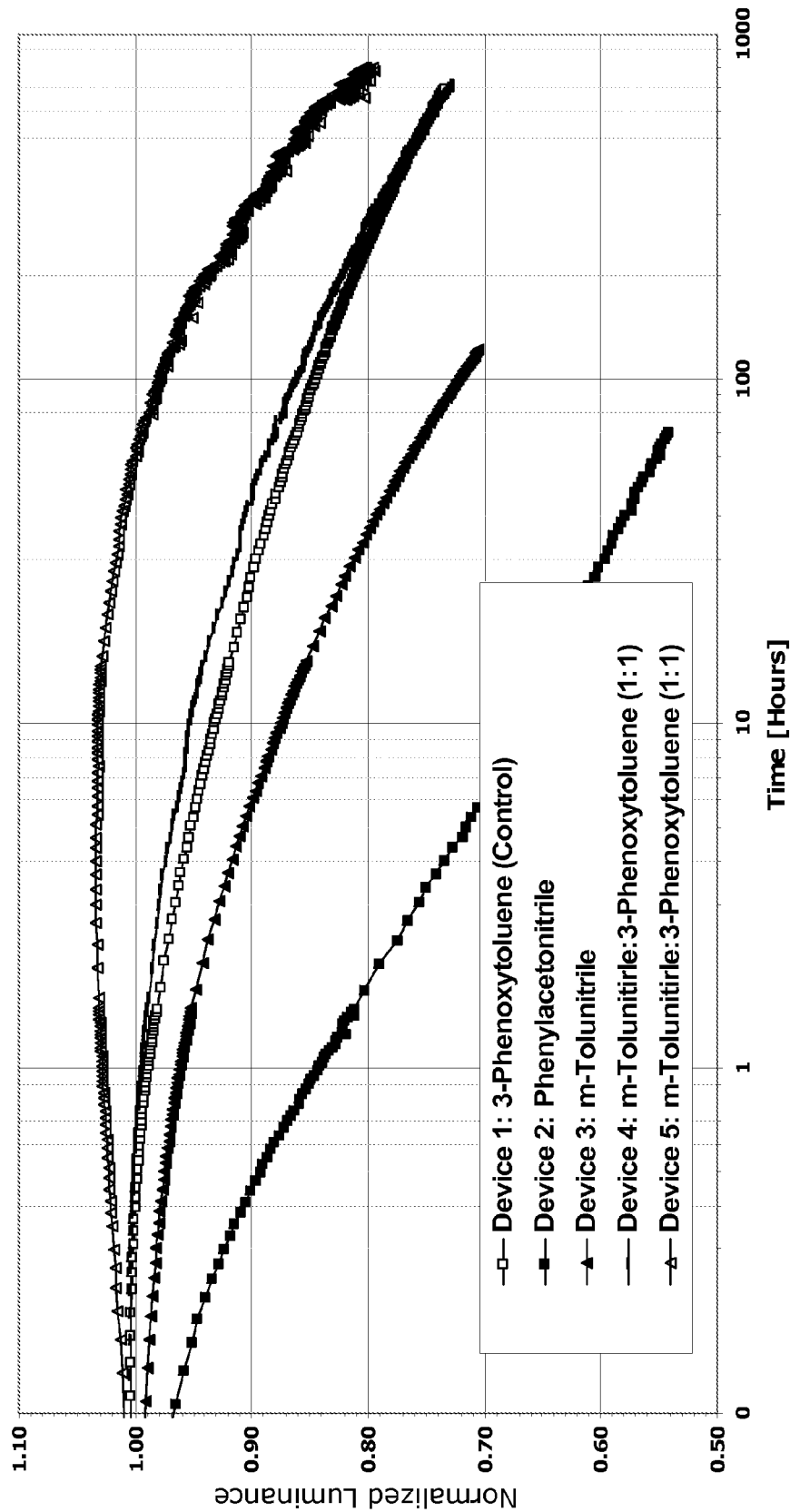
FIG. 2 shows the operating lifetime of example devices 1-5 depicted as a plot of luminous intensity over time.

Table 1 above shows the voltage (V) that was needed to drive a constant current of 10 mA/cm$^2$ current density; luminous efficiency (LE) when operating at 10 mA/cm$^2$ current density; device lifetime as measured by time to decay of luminance to 80% of an initial luminance of 2,000 nits; and CIE color space coordinates of the emitted light. The operating lifetimes of the example OLEDs are also shown in FIG. 2, where they are depicted as a plot of luminous intensity over time.

The relatively lower lifetimes in the devices made using the aromatic nitrile solvents only (devices 2 and 3) is believed to be an equipment limitation related to the size of the inkjet printer that was used. The print speed of the table-top inkjet printer used to make these devices was not sufficiently fast compared to the drying time of the nitrile solvents. This inadequate printer speed is believed to have caused poor film morphology. It is expected that this problem can be addressed by the use of larger, industrial scale inkjet printers. But in these experiments, this problem was addressed by mixing the nitrile solvent with 3-phenyoxytoluene, which is a higher boiling point solvent. The higher boiling point of 3-phenyoxytoluene reduces the rate of solvent evaporation to allow more time for good film formation. These results demonstrate that the use of aromatic solvents of the present invention to deposit an organic layer by solution processing can enhance device performance.

In certain embodiments, the aromatic solvent may be mixed with another solvent (having a melting point of 25° C. or lower) to enhance film formation and/or reduce defects in the deposited organic layer. This second solvent can have various properties to complement those of the aromatic solvent, including having a higher boiling point than the aromatic solvent, or having a higher degree of interaction with the organic semiconductor material than the aromatic solvent.

The foregoing description and examples have been set forth merely to illustrate the invention and are not intended to be limiting. Each of the disclosed aspects and embodiments of the present invention may be considered individually or in combination with other aspects, embodiments, and variations of the invention. In addition, unless otherwise specified, none of the steps of the methods of the present invention are confined to any particular order of performance. Modifications of the disclosed embodiments incorporating the spirit and substance of the invention may occur to persons skilled in the art and such modifications are within the scope of the present invention.

TABLE 2

| MATERIAL | EXAMPLES OF MATERIAL | PUBLICATIONS |
|---|---|---|
| Phosphorescent OLED host materials | | |
| Red hosts | | |
| Arylcarbazoles | 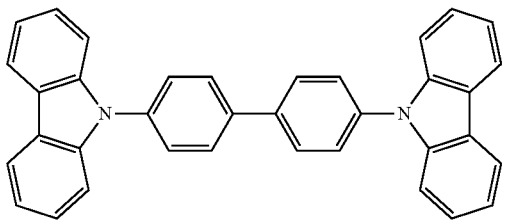 [SMILES: c1ccc2c(c1)c1ccccc1n2-c1ccc(-c2ccc(-n3c4ccccc4c4ccccc43)cc2)cc1] | Appl. Phys. Lett. 78, 1622 (2001) |
| Metal 8-hydroxyquinolates (e.g., Alq$_3$, BAlq) | 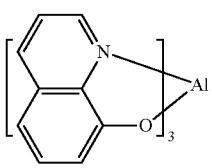 | Nature 395, 151 (1998) |
| | 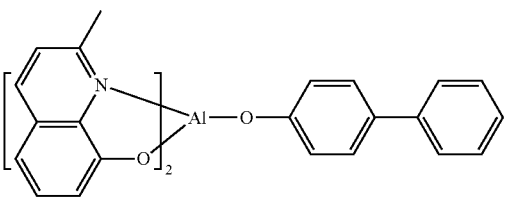 | US20060202194 |
| | 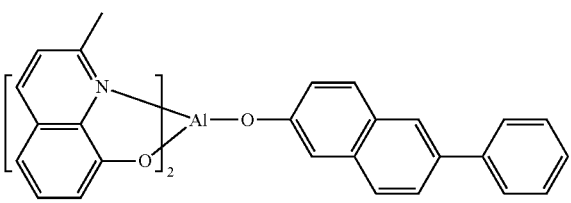 | WO2005014551 |

TABLE 2-continued

| MATERIAL | EXAMPLES OF MATERIAL | PUBLICATIONS |
| --- | --- | --- |
| | (structure) | WO2006072002 |
| Metal phenoxybenzothiazole compounds | (structure) | Appl. Phys. Lett. 90, 123509 (2007) |
| Conjugated oligomers and polymers (e.g., polyfluorene) | (structure) | Org. Electron. 1, 15 (2000) |
| Aromatic fused rings | (structure) | WO2009066779, WO2009066778, WO2009063833, US20090045731, US20090045730, WO2009008311, US20090008605, US20090009065 |
| Zinc complexes | (structure) | WO2009062578 |
| Green hosts | | |
| Arylcarbazoles | (structure) | Appl. Phys. Lett. 78, 1622 (2001) |

TABLE 2-continued
| MATERIAL | EXAMPLES OF MATERIAL | PUBLICATIONS |
|---|---|---|
| | 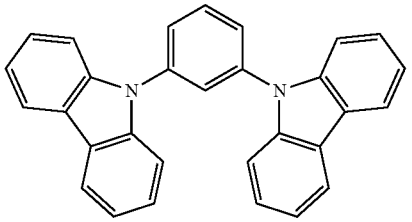 [SMILES: c1cc(-n2c3ccccc3c3ccccc32)cc(-n2c3ccccc3c3ccccc32)c1] | US20030175553 |
| | 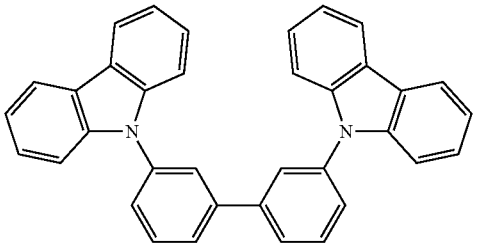 [SMILES: c1cc(-c2cccc(-n3c4ccccc4c4ccccc43)c2)cc(-n2c3ccccc3c3ccccc32)c1] | WO2001039234 |
| Aryltriphenylene compound | 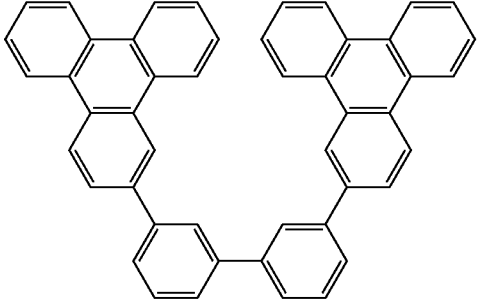 [SMILES: c1cc(-c2cccc(-c3ccc4c5ccccc5c5ccccc5c4c3)c2)cc(-c2ccc3c4ccccc4c4ccccc4c3c2)c1] | US20060280965 |
| | 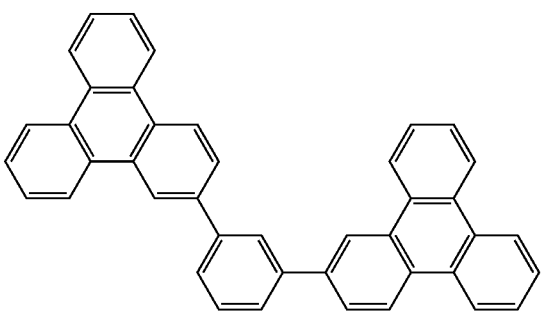 [SMILES: c1cc(-c2ccc3c4ccccc4c4ccccc4c3c2)cc(-c2ccc3c4ccccc4c4ccccc4c3c2)c1] | US20060280965 |
| | 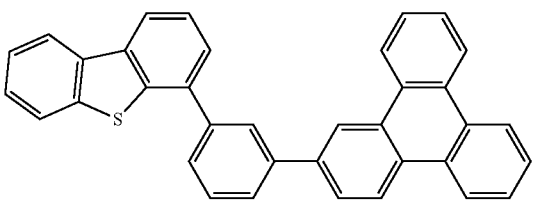 [SMILES: c1cc(-c2ccc3c4ccccc4c4ccccc4c3c2)cc(-c2cccc3c2sc2ccccc23)c1] | WO2009021126 |

TABLE 2-continued
| MATERIAL | EXAMPLES OF MATERIAL | PUBLICATIONS |
|---|---|---|
| Donor acceptor type molecules | 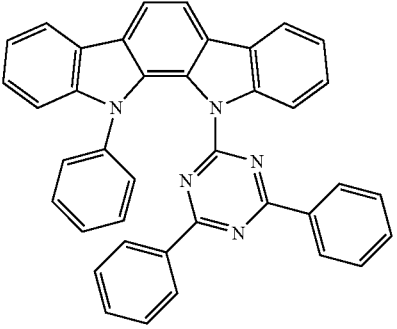 [SMILES: c1ccc(-c2nc(-c3ccccc3)nc(-n3c4ccccc4c4ccc5c6ccccc6n(-c6ccccc6)c5c43)n2)cc1] | WO2008056746 |
| Aza-carbazole/DBT/DBF | 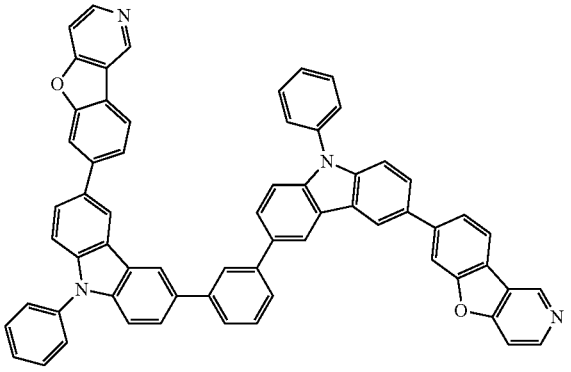 [SMILES: c1ccc(-n2c3ccc(-c4cccc(-c5ccc6c(c5)c5cc(-c7ccc8c(c7)oc7ccncc78)ccc5n6-c5ccccc5)c4)cc3c3cc(-c4ccc5c(c4)oc4ccncc45)ccc32)cc1] | JP2008074939 |
| Polymers (e.g., PVK) | 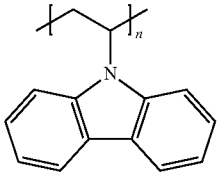 | Appl. Phys. Lett. 77, 2280 (2000) |
| Spirofluorene compounds | 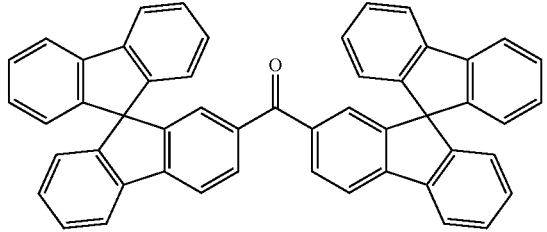 [SMILES: O=C(c1ccc2c(c1)C1(c3ccccc3-c3ccccc31)c1ccccc1-2)c1ccc2c(c1)C1(c3ccccc3-c3ccccc31)c1ccccc1-2] | WO2004093207 |
| Metal phenoxybenzooxazole compounds | 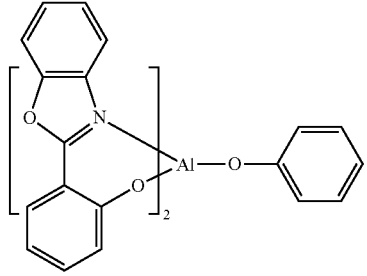 | WO2005089025 |

TABLE 2-continued

| MATERIAL | EXAMPLES OF MATERIAL | PUBLICATIONS |
|---|---|---|
| | | WO2006132173 |
| | | JP200511610 |
| Spirofluorene-carbazole compounds | | JP2007254297 |
| | | JP2007254297 |
| Indolocabazoles | | WO2007063796 |

TABLE 2-continued

| MATERIAL | EXAMPLES OF MATERIAL | PUBLICATIONS |
|---|---|---|
| | | WO2007063754 |
| 5-member ring electron deficient heterocycles (e.g., triazole, oxadiazole) | | J. Appl. Phys. 90, 5048 (2001) |
| | | WO2004107822 |
| Tetraphenylene complexes | | US20050112407 |
| Metal phenoxypyridine compounds | | WO2005030900 |

| MATERIAL | EXAMPLES OF MATERIAL | PUBLICATIONS |
|---|---|---|
| Metal coordination complexes (e.g., Zn, Al with N^N ligands) | | US20040137268, US20040137267 |
| Blue hosts | | |
| Arylcarbazoles | | Appl. Phys. Lett, 82, 2422 (2003) |
| | | US20070190359 |
| Dibenzothiophene/ Dibenzofuran-carbazole compounds | | WO2006114966, US20090167162 |
| | | US20090167162 |
| | | WO2009086028 |

TABLE 2-continued

| MATERIAL | EXAMPLES OF MATERIAL | PUBLICATIONS |
|---|---|---|
| | | US20090030202, US20090017330 |
| Silicon aryl compounds | | US20050238919 |
| | | WO2009003898 |
| Silicon/Germanium aryl compounds | | EP2034538A |
| Aryl benzoyl ester | | WO2006100298 |

TABLE 2-continued

| MATERIAL | EXAMPLES OF MATERIAL | PUBLICATIONS |
| --- | --- | --- |
| High triplet metal organometallic complex | | U.S. Pat. No. 7,154,114 |

Phosphorescent dopants

Red dopants

| | | |
| --- | --- | --- |
| Heavy metal porphyrins (e.g., PtOEP) | | Nature 395, 151 (1998) |
| Iridium(III) organometallic complexes | | Appl. Phys. Lett. 78, 1622 (2001) |
| | | US2006835469 |
| | | US2006835469 |

TABLE 2-continued

| MATERIAL | EXAMPLES OF MATERIAL | PUBLICATIONS |
|---|---|---|
| | | US20060202194 |
| | | US20060202194 |
| | | US20070087321 |
| | | US20070087321 |
| | | Adv. Mater. 19, 739 (2007) |

TABLE 2-continued

| MATERIAL | EXAMPLES OF MATERIAL | PUBLICATIONS |
|---|---|---|
| | | WO2009100991 |
| | | WO2008101842 |
| Platinum(II) organometallic complexes | | WO2003040257 |
| Osminum(III) complexes | | Chem. Mater. 17, 3532 (2005) |
| Ruthenium(II) complexes | | Adv. Mater. 17, 1059 (2005) |

TABLE 2-continued
| MATERIAL | EXAMPLES OF MATERIAL | PUBLICATIONS |
|---|---|---|
| Rhenium (I), (II), and (III) complexes | 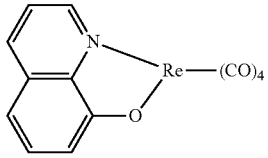 | US20050244673 |
| Green dopants | | |
| Iridium(II) organometallic complexes | 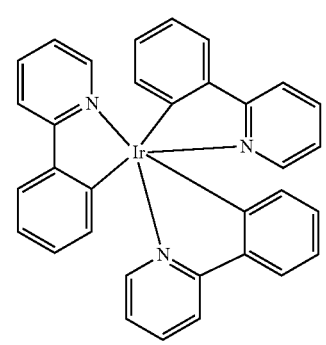<br>and its derivatives | Inorg. Chem. 40, 1704 (2001) |
| | 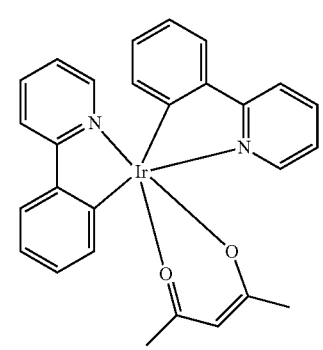 | US20020034656 |
| | 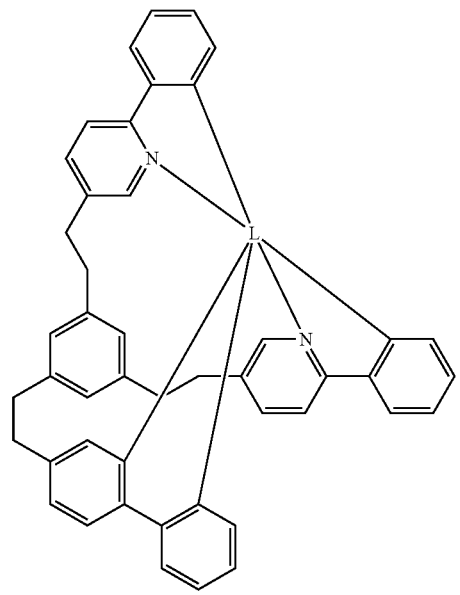 | U.S. Pat. No. 7,332,232 |

TABLE 2-continued

| MATERIAL | EXAMPLES OF MATERIAL | PUBLICATIONS |
|---|---|---|
| | | US20090108737 |
| | | US20090039776 |
| | | U.S. Pat. No. 6,921,915 |
| | | U.S. Pat. No. 6,687,266 |
| | | Chem. Mater. 16, 2480 (2004) |

TABLE 2-continued

| MATERIAL | EXAMPLES OF MATERIAL | PUBLICATIONS |
|---|---|---|
| | | US20070190359 |
| | | US20060008670<br>JP2007123392 |
| | | Adv. Mater. 16, 2003 (2004) |
| | | Angew. Chem. Int. Ed. 2006, 45, 7800 |
| | | WO2009050290 |
| | | US20090165846 |

TABLE 2-continued

| MATERIAL | EXAMPLES OF MATERIAL | PUBLICATIONS |
|---|---|---|
| | | US20080015355 |
| Monomer for polymeric metal organometallic compounds | | U.S. Pat. No. 7,250,226, U.S. Pat. No. 7,396,598 |
| Pt(II) organometallic complexes, including polydentated ligands | | Appl. Phys. Lett. 86, 153505 (2005) |
| | | Appl. Phys. Lett. 86, 153505 (2005) |
| | | Chem. Lett. 34, 592 (2005) |

TABLE 2-continued
| MATERIAL | EXAMPLES OF MATERIAL | PUBLICATIONS |
|---|---|---|
| | 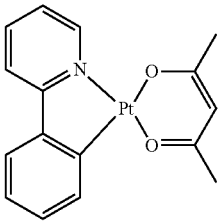 | WO2002015645 |
| | 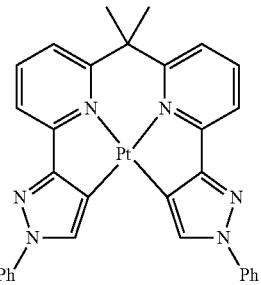 | US20060263635 |
| Cu complexes | 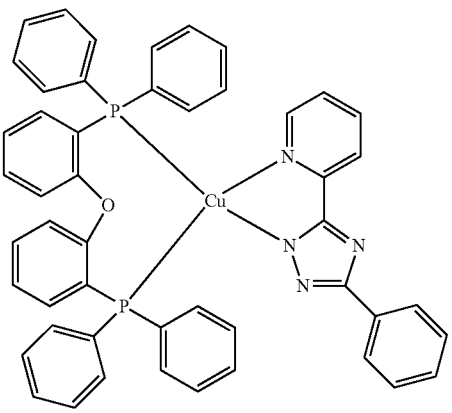 | WO2009000673 |
| Gold complexes | 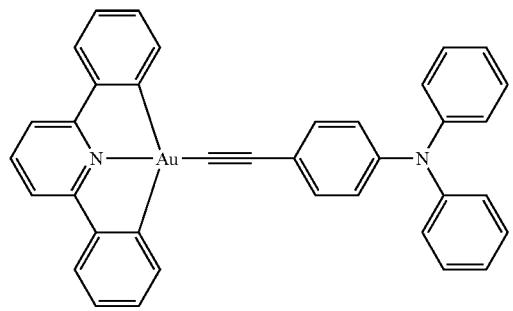 | Chem. Commun. 2906 (2005) |
| Rhenium(III) complexes | 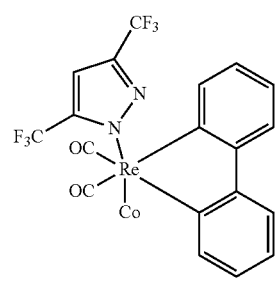 | Inorg. Chem. 42, 1248 (2003) |

TABLE 2-continued

| MATERIAL | EXAMPLES OF MATERIAL | PUBLICATIONS |
| --- | --- | --- |
| Deuterated organometallic complexes | | US20030138657 |
| Organometallic complexes with two or more metal centers | | US20030152802 |
| | | U.S. Pat. No. 7,090,928 |
| Blue dopants | | |
| Iridium(III) organometallic complexes | | WO2002002714 |

TABLE 2-continued
| MATERIAL | EXAMPLES OF MATERIAL | PUBLICATIONS |
|---|---|---|
| | 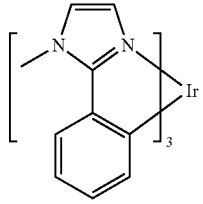 | WO2006009024 |
| | 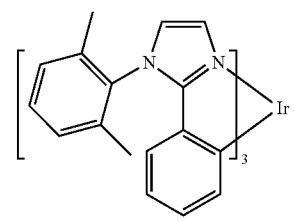 | US20060251923 |
| | 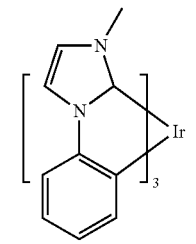 | U.S. Pat. No. 7,393,599, WO2006056418, US20050260441, WO2005019373 |
| | 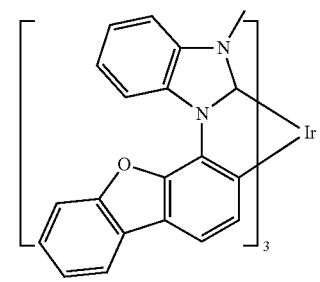 | U.S. Pat. No. 7,534,505 |
| | 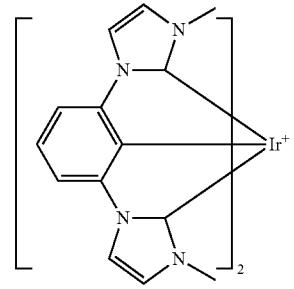 | U.S. Pat. No. 7,445,855 |
| | 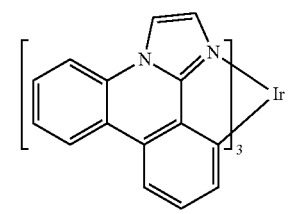 | US20070190359, US20080297033 |

TABLE 2-continued
| MATERIAL | EXAMPLES OF MATERIAL | PUBLICATIONS |
|---|---|---|
| | 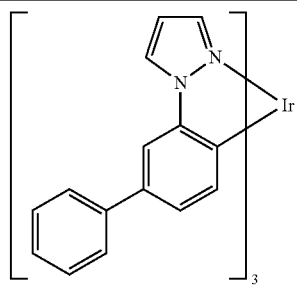 | U.S. Pat. No. 7,338,722 |
| | 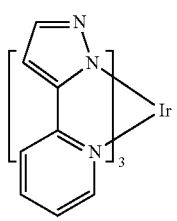 | US20020134984 |
| | 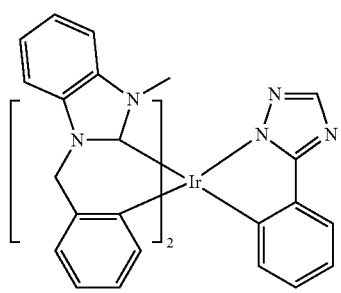 | Angew. Chem. Int. Ed. 47, 1 (2008) |
| | 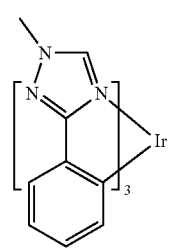 | Chem. Mater. 18, 5119 (2006) |
| | 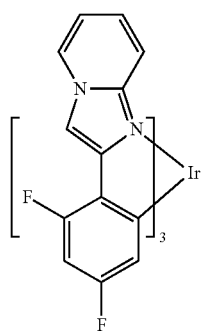 | Inorg. Chem. 46, 4308 (2007) |

TABLE 2-continued

| MATERIAL | EXAMPLES OF MATERIAL | PUBLICATIONS |
|---|---|---|
| | | WO2005123873 |
| | | WO2005123873 |
| | | WO2007004380 |
| | | WO2006082742 |
| Osmium(II) complexes | | U.S. Pat. No. 7,279,704 |

TABLE 2-continued

| MATERIAL | EXAMPLES OF MATERIAL | PUBLICATIONS |
|---|---|---|
| | (Os(PPh₃) complex structure) | Organometallics 23, 3745 (2004) |
| Gold complexes | (Ph₂P-CH₂-PPh₂ bridged Au-Cl dimer structure) | Appl. Phys. Lett. 74, 1361 (1999) |
| Platinum(II) complexes | (Pt complex structure) | WO2006098120, WO2006103874 |

We claim:

1. A liquid composition comprising:
   a small molecule organic semiconductor material at a concentration in the range 0.01-10 wt %; and
   an aromatic solvent having a melting point of 25° C. or lower, the aromatic solvent compound having the following formula:

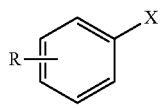

wherein (A) R represents one or more substituents on the benzene ring, wherein each R is independently an aliphatic group containing from 1-15 carbon atoms, and X is a substitution group that contains an electron-withdrawing group selected from sulfonyl and —$(CH_2)_n CN$, wherein "n" is 1-6; or
(B) R represents one or more substituents on the benzene ring, wherein each R is independently an aliphatic group containing from 2-15 carbon atoms, and X is a substitution group that contains an electron-withdrawing group selected from nitrile, sulfonyl and trifluoromethyl.

2. The liquid composition of claim 1, wherein the aromatic solvent is an aromatic nitrile solvent.

3. The liquid composition of claim 1, wherein the aromatic solvent has a boiling point in the range of 160-260° C. at 1 atm.

4. The liquid composition of claim 1, wherein the aromatic solvent compound has a molecular weight in the range of 95-250.

5. The liquid composition of claim 1, further comprising a second solvent having a melting point of 25° C. or lower, the second solvent having a higher boiling point than the aromatic solvent.

6. The liquid composition of claim 1, wherein the small molecule organic semiconductor material is a phosphorescent emitting compound.

7. The liquid composition of claim 6, further comprising a small molecule host compound.

8. The liquid composition of claim 1, wherein R represents one or more optional substituents on the benzene ring, wherein each R is independently an aliphatic group containing from 1-15 carbon atoms, and X is a substitution group that contains an electron-withdrawing group selected from sulfonyl and —$(CH_2)_n CN$, wherein "n" is 1-6.

9. The liquid composition of claim 1, wherein R represents one or more optional substituents on the benzene ring, wherein each R is independently an aliphatic group containing from 2-15 carbon atoms, and X is a substitution group that contains an electron-withdrawing group selected from nitrile, sulfonyl and trifluoromethyl.

10. A method of forming an organic layer for an organic electronic device, comprising:
    depositing the liquid composition of claim 1 on a surface; and
    drying the liquid composition to form the organic layer on the surface.

11. The method of claim 10, wherein the step of depositing is performed by inkjet printing.

12. The method of claim 10, wherein the aromatic solvent remains as a residue in the organic layer after drying of the liquid composition.

13. The method of claim 10, wherein the organic electronic device is an organic light-emitting device, and wherein the organic layer is an emissive layer of the device.

14. An organic electronic device comprising an organic layer, the organic layer comprising a small molecule organic semiconductor material and an aromatic nitrile compound having a melting point of 25° C. or lower; the aromatic nitrile compound having the following formula:

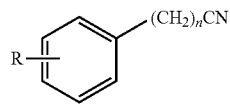

wherein "n" is 1-6; and wherein R represents one or more substituents on the benzene ring, wherein each R is independently an aliphatic group containing from 1-15 carbon atoms.

15. The device of claim 14, wherein the aromatic nitrile compound is a solvent residue.

16. The device of claim 14, wherein the aromatic nitrile compound is present in the organic layer at a concentration of up to 1 wt % of the organic layer.

17. A liquid composition comprising: a small molecule host compound; a small molecule phosphorescent emitting compound; and an aromatic solvent having a melting point of 25° C. or lower, wherein the aromatic solvent has an electrical resistivity lower than that of anisole, and wherein the aromatic solvent compound has an energy band gap wider than that of the phosphorescent emitting compound, and wherein the aromatic solvent has the formula:

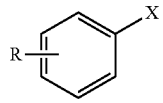

wherein:
(A) R represents one or more substituents on the benzene ring, wherein each R is independently an aliphatic group containing from 1-15 carbon atoms, and wherein X is a substituent group that contains an electron-withdrawing group selected from sulfonyl and $-(CH_2)_nCN$, wherein "n" is 1-6: or
(B) R represents one or more substituents on the benzene ring, wherein each R is independently an aliphatic group containing from 2-15 carbon atoms, and wherein X is a substituent group that contains an electron-withdrawing group selected from nitrile, sulfonyl and trifluoromethyl.

18. The liquid composition of claim 17, wherein the aromatic solvent compound has a molecular weight in the range of 95-250.

19. The liquid composition of claim 17, wherein the aromatic solvent has a boiling point in the range of 160-260° C. at 1 atm.

20. A method of forming an emissive layer for an organic light-emitting device, comprising:
depositing the liquid composition of claim 17 on a surface; and
drying the liquid composition to form the organic layer on the surface.

21. The method of claim 20, wherein the step of depositing is performed by inkjet printing.

22. The method of claim 20, wherein the aromatic solvent remains as a residue in the organic layer after drying of the liquid composition.

* * * * *